(12) United States Patent
Vasudevan

(10) Patent No.: US 7,733,075 B1
(45) Date of Patent: Jun. 8, 2010

(54) VOLTAGE SENSING IN A SUPPLY REGULATOR FOR A SUSPEND MODE

(75) Inventor: Narasimhan Vasudevan, Los Angeles, CA (US)

(73) Assignee: XILINX, Inc., San Jose, CA (US)

( * ) Notice: Subject to any disclaimer, the term of this patent is extended or adjusted under 35 U.S.C. 154(b) by 381 days.

(21) Appl. No.: 11/978,010

(22) Filed: Oct. 26, 2007

(51) Int. Cl.
*G05F 3/16* (2006.01)

(52) U.S. Cl. ..................................................... 323/314

(58) Field of Classification Search ................. 323/265, 323/273, 280, 281, 303, 311, 312, 313, 314; 327/530, 545, 546
See application file for complete search history.

(56) References Cited

U.S. PATENT DOCUMENTS

| | | | |
|---|---|---|---|
| 5,216,289 A | | 6/1993 | Hahn et al. |
| 5,786,724 A | | 7/1998 | Teggatz |
| 5,844,404 A | * | 12/1998 | Caser et al. ................. 323/314 |
| 5,982,677 A | * | 11/1999 | Fontana et al. ......... 365/189.09 |
| 6,232,753 B1 | * | 5/2001 | Pasotti et al. ................. 323/267 |
| 6,456,557 B1 | * | 9/2002 | Dadashev et al. ........... 365/226 |
| 6,504,778 B1 | * | 1/2003 | Uekubo ................. 365/189.15 |
| 6,614,210 B2 | * | 9/2003 | Sundaram et al. ........... 323/354 |
| 6,653,751 B1 | | 11/2003 | Teh Lo |
| 7,046,074 B2 | | 5/2006 | Jang |
| 7,215,043 B2 | | 5/2007 | Tsai et al. |
| 7,265,605 B1 | | 9/2007 | Vasudevan |
| 2004/0084966 A1 | | 5/2004 | Yarbrough |
| 2004/0140719 A1 | | 7/2004 | Vulih et al. |
| 2004/0174150 A1 | * | 9/2004 | Zhang et al. ................. 323/274 |
| 2005/0146230 A1 | | 7/2005 | Tsai et al. |
| 2007/0069807 A1 | | 3/2007 | Ho |
| 2008/0174181 A1 | | 7/2008 | Kuo |
| 2009/0195301 A1 | * | 8/2009 | Narayanan et al. .......... 327/539 |

OTHER PUBLICATIONS

U.S. Appl. No. 11/977,863, filed Oct. 26, 2007, Vasudevan.
U.S. Appl. No. 11/977,831, filed Oct. 26, 2007, Vasudevan.

* cited by examiner

*Primary Examiner*—Adolf Berhane
(74) *Attorney, Agent, or Firm*—W. Eric Webostad

(57) ABSTRACT

A voltage regulator for supplying power to volatile memory cells during a suspend mode of an integrated circuit is described. The integrated circuit in an awake mode generates a regulated voltage at an output node using a first supply voltage and in the suspend mode generates the regulated voltage at the output node using a second supply voltage, at less voltage than the first supply voltage. The second supply voltage is electrically decoupled from the output node for transitioning from the suspend mode to the awake mode, and the first supply voltage is electrically decoupled from the output node for transitioning from the awake mode to the suspend mode.

20 Claims, 4 Drawing Sheets

VOLTAGE SENSING IN A SUPPLY REGULATOR FOR A SUSPEND MODE

FIELD OF THE INVENTION

The invention relates to integrated circuit devices (ICs). More particularly, the invention relates to voltage sensing in a supply regulator for a suspend mode of an IC.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external programmable read-only memory (PROM)) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

PLDs, as well as other integrated circuits (ICs), may consume a significant amount of power in a fully operational mode, namely an "awake mode." More recently, PLDs have been configured with a dedicated low power mode of operation, namely a "suspend mode." With respect to PLDs, as well as other integrated circuits having volatile memory, information may be lost if power to such volatile memory is shut-off. Heretofore, for PLDs, power to such volatile memory associated with configuration memory was shut-off when using a suspend mode to conserve power. Thus, state of configuration of such configuration memory was lost due to conserving power by operating in a suspend mode. In order to maintain state of such configuration, a separate non-volatile memory may be used to store for example configuration information for configuring a PLD; however, a separate non-volatile memory adds cost and involves writing back the configuration state to configuration memory.

Accordingly, it would be desirable and useful to provide means to have some reduction in power consumption as compared to operation in an awake mode without losing information stored in volatile memory when in a suspend mode.

SUMMARY OF THE INVENTION

One or more aspects generally relate to integrated circuit devices (ICs). More particularly, the one or more aspects relate to voltage sensing in a supply regulator for a suspend mode of an IC.

An aspect of a voltage regulator is described. The voltage regulator includes: a first transistor coupled at a source node thereof to a first supply voltage and coupled at a gate thereof to receive the gating voltage; and a second transistor coupled at a source node thereof to a second supply voltage. The second supply voltage has a logic high voltage level which is substantially less than that of the first supply voltage. The first transistor and the second transistor each have a drain node which is coupled at an output node, and the regulated voltage is provided from the output node in part for a feedback input to the amplifier. Volatile memory cells are coupled to the output node for receiving the regulated voltage therefrom. The voltage regulator further includes: control circuitry coupled to receive a first control signal and configured for providing control signaling, where the control signaling includes at least a second control signal; a third transistor coupled at a source node thereof to a ground potential and coupled at a gate thereof to receive the second control signal; and a resistive load coupled to receive the first supply voltage. A drain node of the third transistor and the resistive load each coupled at a sense node, and the second transistor is coupled at a gate thereof to receive a sense voltage obtained from the sense node.

An aspect of a method for regulating voltage is described. An integrated circuit toggles between a suspend mode and an awake mode. In the awake mode, a regulated voltage is generated at an output node using a first supply voltage, which has a first voltage level. In the suspend mode, the regulated voltage is generated at the output node using a second supply voltage, which has a second voltage level that is substantially less than the first voltage level. A reference voltage and the regulated voltage are input to an amplifier, and a gating voltage is produced from the amplifier. The amplifier is disabled for bias circuit operation thereof for the suspend mode, wherein the gating voltage is provided from the amplifier at the first voltage level. The amplifier is activated for the bias circuit operation thereof for the awake mode, wherein the gating voltage is less than the first voltage level and greater than a regulated voltage level of the regulated voltage. The second supply voltage is electrically decoupled from the output node for transitioning from the suspend mode to the awake mode, and the first supply voltage is electrically decoupled from the output node for transitioning from the awake mode to the suspend mode.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
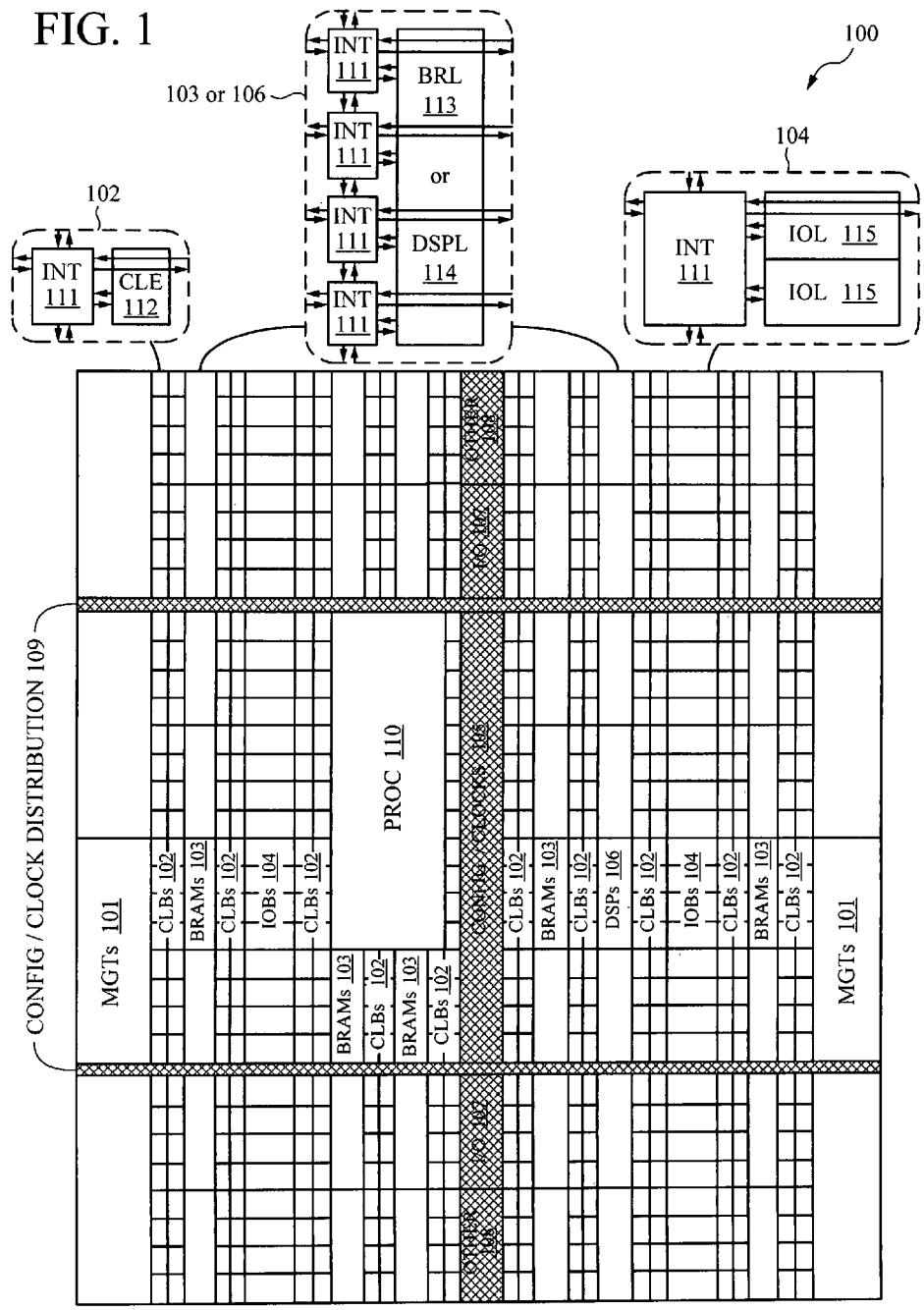
FIG. 1 is an exemplary embodiment of a field programmable gate array (FPGA) architecture that includes a large number of different programmable tiles.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA: The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown crosshatched in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block PROC 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Although FIG. 1 represents a Virtex-4™ from Xilinx, Inc. of San Jose, Calif., other FPGAs, such as for example Spartan™-3A generation FPGAs from Xilinx, Inc. of San Jose, Calif., have a "suspend" mode that allows users to provide a "suspend" signal to an external pin to "shut-off" power consumption associated with use of a supply voltage, namely VCCAUX, to reduce static power.

FPGAs generally have several types of supply voltage input pins. For example, some FPGAs have VCCO, VCCAUX, and VCCINT as separate types of supply voltages that are provided from one or more external sources via external pins. VCCO is an externally provided supply voltage generally used to power output drivers. VCCAUX is an externally provided supply voltage generally used to power configuration memory, analog blocks, DCMs, and some I/O resources. VCCINT is an externally provided supply voltage, which is generally used to power programmable logic, including CLBs, of an FPGA, namely the "core logic" of an FPGA.

VCCINT is conventionally supplied in a range of approximately 1.0 to 1.2 volts, and VCCAUX is conventionally supplied in a range of approximately 2.5 to 3.3 volts. Both of such voltages may vary outside of these ranges within some threshold amount. Furthermore, values other than these voltages for VCCINT and VCCAUX may be used provided, however, that VCCINT is lower than VCCAUX, namely an upper most value of VCCINT is less than a lower most value of VCCAUX.

Heretofore, configuration memory was not powered using VCCINT in a suspend mode. Thus, use of the suspend mode for "shutting-off" power consumption associated with use of VCCAUX previously meant losing information stored in configuration memory, as such configuration memory was powered by VCCAUX. It should further be understood that configuration memory cells are volatile memory cells, such as Static Random Access Memory (SRAM) cells and Dynamic Random Access Memory (DRAM) cells. Of note, voltage levels for various memory technologies may be different; however, the embodiments described below may be used with any of a variety of voltages provided, however, that VCCINT is lower than VCCAUX.

In the embodiments described below, VCCINT is provided as a supply voltage to configuration memory cells when in a suspend mode. More particularly, the lower voltage of VCCINT may be used to maintain state of information stored in such configuration memory cells during a suspend mode. In a non-suspend mode, namely an awake mode, VCCAUX is used to supply voltage to configuration memory cells. As leakage is exponentially dependent on voltage at node VGG 209, there may be significant savings in current drawn by reducing voltage of VGG 209 voltage by a relatively small amount. For example, reducing voltage on the order of approximately 300 mV to 400 mV for the above identified voltage ranges may result in significant reduction in current draw. Moreover, the greater the difference between VCCINT 207 and VGG 209 in an awake mode may contribute to a more significant reduction in current draw.

By using VCCINT instead of VCCAUX to power configuration memory during a suspend mode, significant static power reduction may be achieved without losing configuration information stored in configuration memory. For an implementation in Spartan™-3A generation FPGAs, static power consumption for a suspend mode may be reduced by electrically decoupling VCCAUX to effectively shut-off power consumption associated with analog and I/O resources, while maintaining information stored in configuration memory using VCCINT. Thus, VCCAUX no longer has to be electrically coupled to configuration memory cells to maintain configuration information while in a suspend mode. Furthermore, VCCINT may be used to power only configuration memory in a suspend mode and need not be used for any other purpose.

In the following description, circuitry to implement use of VCCINT instead of VCCAUX for powering configuration memory is described. As described below in additional detail, this circuitry is added to one or more voltage regulators of an FPGA to facilitate use of VCCINT instead of VCCAUX for powering configuration memory during a suspend mode without adding significant complexity. In addition to being an elegant solution, it shall be appreciated that a voltage regulator described below in additional detail is capable of transitioning from awake mode to suspend mode and from suspend mode to awake mode with little to no current draw between VCCAUX and VCCINT supplies and with little to no regulated voltage (VGG) droop. Control signals for turning ON and OFF of transistors used to generate output voltage as described herein are based on self-timed principles. Transistors are turned ON and OFF in a controlled manner to prevent any race conditions that may cause current and voltage droop.

Because write voltage supplied for configuration memory is higher than the voltage level of VCCINT, VCCAUX is used during an awake mode for powering configuration memory. Basically, the lower read voltage (e.g., 1.2 volts) is used so as not to disturb state of configuration memory by use of a higher write voltage (e.g., 1.5 volts). Thus, VCCINT is not used during an awake mode for operation of configuration memory, as it is generally too low in voltage level for reliable write operation to configuration memory. Thus, in order to use VCCINT in a suspend mode, capability for toggling between VCCAUX and VCCINT for operation in a suspend mode and an awake mode, respectively, is provided.

Figure 2:
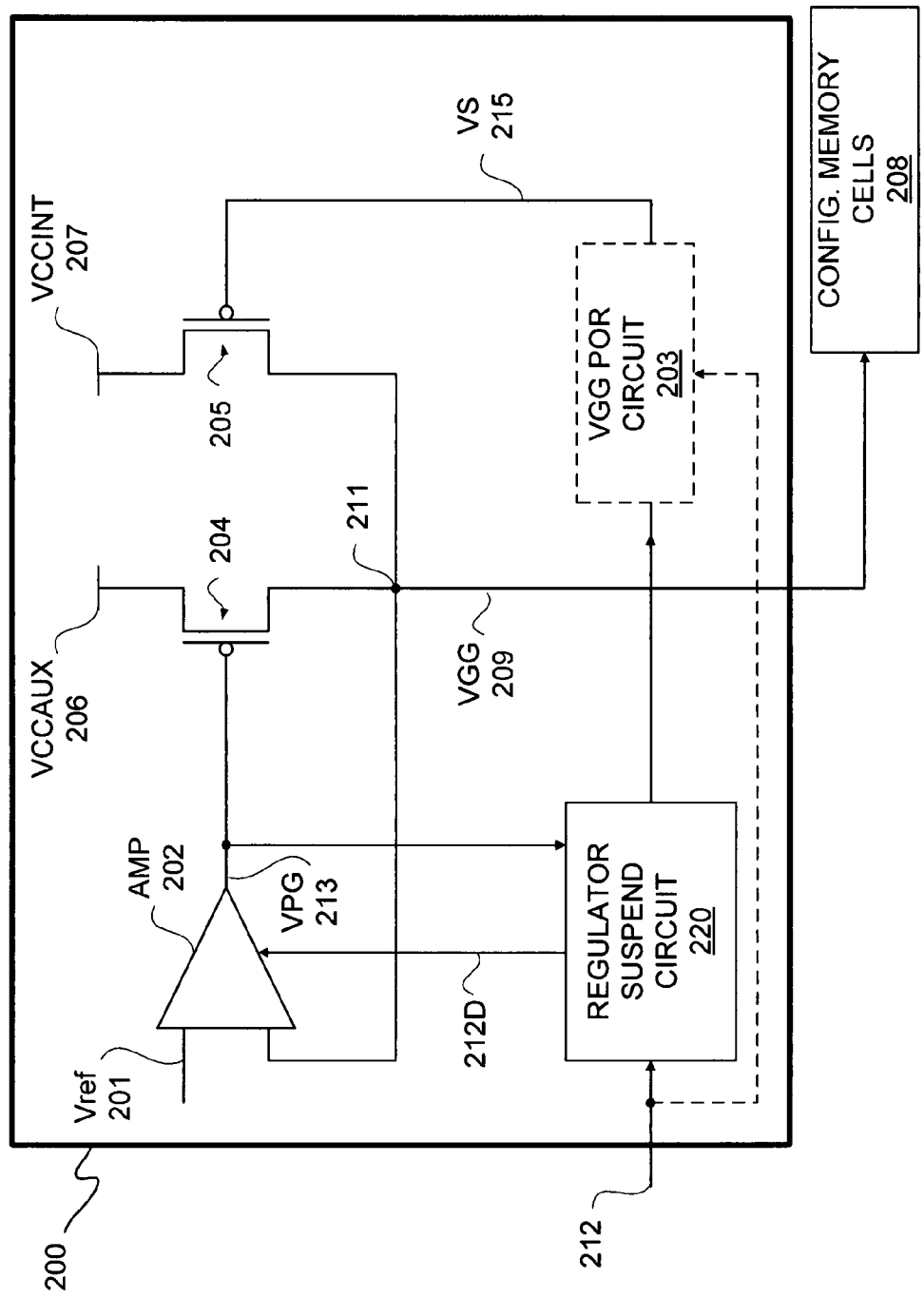
FIG. 2 is a block/circuit diagram depicting an exemplary embodiment of a voltage regulator, which may be coupled to configuration memory cells.

FIG. 2 is a block/circuit diagram depicting an exemplary embodiment of a voltage regulator 200, which may be coupled to configuration memory cells 208. Configuration memory cells 208 may be configuration memory cells associated with CLBs, such as CLBs 102 of FPGA of FIG. 1.

Voltage regulator 200 is operable in both an awake mode and a suspend mode, which modes are mutually exclusive with respect to one another as described herein. In an awake mode, VCCAUX 206 is generally used to supply voltage for powering configuration memory cells 208. In a suspend mode, VCCINT 207 is generally used for supplying voltage for powering configuration memory cells 208.

A reference voltage (Vref) 201, which may be a band gap reference voltage as is well known, is provided as an input to operational amplifier (AMP) 202. Another input to AMP 202 is sourced from output node 211 of voltage regulator 200. From output node 211, VGG 209 is provided, such as to configuration memory cells 208, and is provided as a feedback input to AMP 202. Output of AMP 202 is provided to a gate of P-channel transistor 204 and as an input to regulator suspend circuit 220. AMP 202, regulator suspend circuit 220, and P-channel transistors 204 and 205 may all be part of voltage regulator 200. Optionally, a VGG power-on reset circuit 203 may be part of voltage regulator 200.

P-channel transistor 204 has its source coupled to VCCAUX 206 and its drain coupled to output node 211. P-channel transistor 205 has its source coupled to VCCINT 207 and its drain coupled to output node 211. A gate of P-channel transistor 205 is coupled to receive a sense voltage (VS) 215 output from regulator suspend circuit 220. Another output from regulator suspend circuit 220 is an optionally delayed version of power-down signal 212, namely power-down signal 312 of FIG. 3A. Power-down signal 212 is provided as an input to regulator suspend circuit 220. Power-down signal 212 is negative logic, and thus may be thought of as a power-down bar or complement signal. Alternatively, an inverter may be used to implement a true or non-complemented version of power-down signal 212. Accordingly, it should be understood that signals as being true or complemented are only for purposes of clarity by way of example and not limitation. Power-down signal 212 may be a globally provided power-down signal as associated with an FPGA, such as FPGA 100 of FIG. 1

It should be appreciated that use of VCCAUX 206 and VCCINT 207 for providing voltage to supply configuration memory cells 208 in an awake mode and suspend mode, respectively, is generally mutually exclusive, as described below in additional detail. Thus, if VCCAUX 206 is used to provide voltage for supplying configuration memory cells 208, VCCINT 207 is generally not used. And, if VCCINT 207 is used for supplying voltage to configuration memory cells 208, VCCAUX 206 is generally not used. There is some crossover of these uses of supply voltages 207 and 206, as described herein. More particularly, when switching from an awake mode to a suspend mode, it is desirable that a negligible amount, if any, of current flows between voltage supplies, namely between VCCINT 207 and VCCAUX 206. Additionally, it should be appreciated that when switching from a suspend mode to an awake mode, having little to no drooping of VGG 209 is desirable. This is because if VGG 209 droops to too low value, volatile memory cells may lose their data. However, this drooping to too low a value is avoided as described herein.

Additionally, for a POR, it may take some time for voltage supplies, such as VCCAUX 206 and VCCINT 207, to reach their respective target voltage levels or ranges. Accordingly, optionally a VGG POR circuit 203 may be coupled to receive power-down signal 212 to gate output of regulator suspend circuit 220 for providing VS 215 to a gate of P-channel transistor 205. Such gating would allow VS 215 to pass only after power-down signal 212 indicates that acceptable levels of VCCAUX 206 and VCCINT 207 have been reached. Power-down signal 212, which for an FPGA such as FPGA 100 of FIG. 1 is conventionally generated from configuration logic, is a known available control signal, and thus its generation is not described in unnecessary detail herein. For purposes of clarity and not limitation, VGG POR circuit 203 is not described in unnecessary detail, and may be considered included as part of control circuitry 301 of FIG. 3A.

Assuming that the initial state for an FPGA, or other integrated circuit, in which voltage regulator 200 is implemented is an awake mode, transition from awake mode to suspend mode shall be described first, followed by a description of a transition from a suspend mode to an awake mode with respect to operation of voltage regulator 200.

Figure 3A:
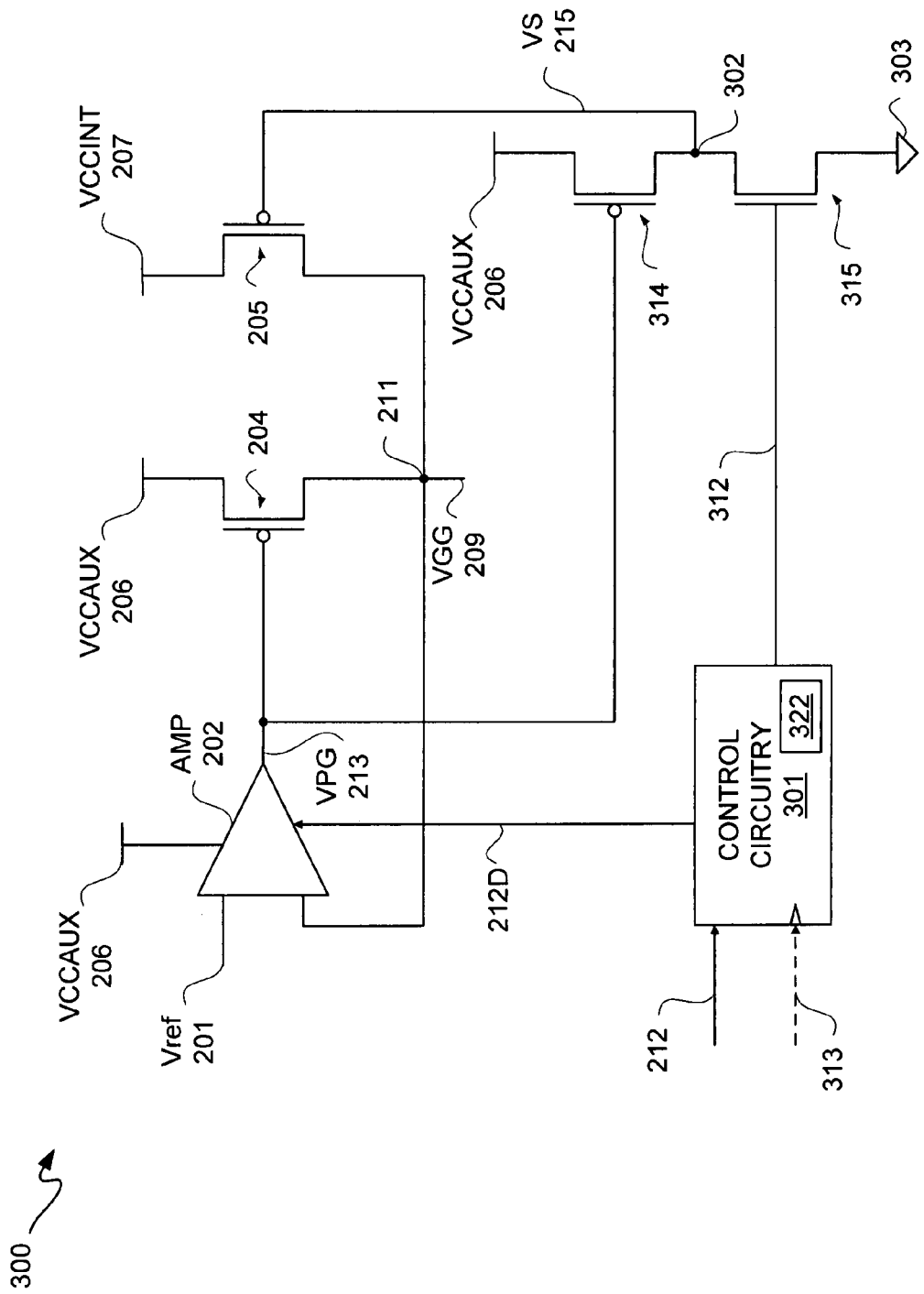
FIG. 3A is a block/circuit diagram depicting an exemplary embodiment of the voltage regulator of FIG. 2.

FIG. 3A is a block/circuit diagram depicting an exemplary embodiment of a voltage regulator 300. Voltage regulator 300 may be voltage regulator 200 of FIG. 2. Accordingly, transitioning from suspend mode to awake mode, and then from awake mode to suspend mode shall be described with respect to voltage regulators 200 and 300 with simultaneous reference to FIGS. 2 and 3.

Power-down signal 212 is provided as input to control circuitry 301, which may include both control circuitry for regulator suspend circuit 220, as well as optional VGG POR circuit 203. Regulator suspend circuit 220 includes transistors 314 and 315, as well as control circuitry 301. Although single instances of transistors are illustratively shown for purposes of clarity, multiple instances of such transistors may be used. Alternatively, transistor 314 may be replaced with a fixed resistor, where droop due to entering to a suspend mode is reduced or avoided by selecting a resistance value of the fixed resistor. Furthermore, alternatively, transistor 315 may be replaced with a fixed resistor, where current draw due to entering a suspend mode is reduced or avoided by delaying of power-down signal 312. In either of these alternatives, one of transistors 314 and 315 is present.

Figure 3B:
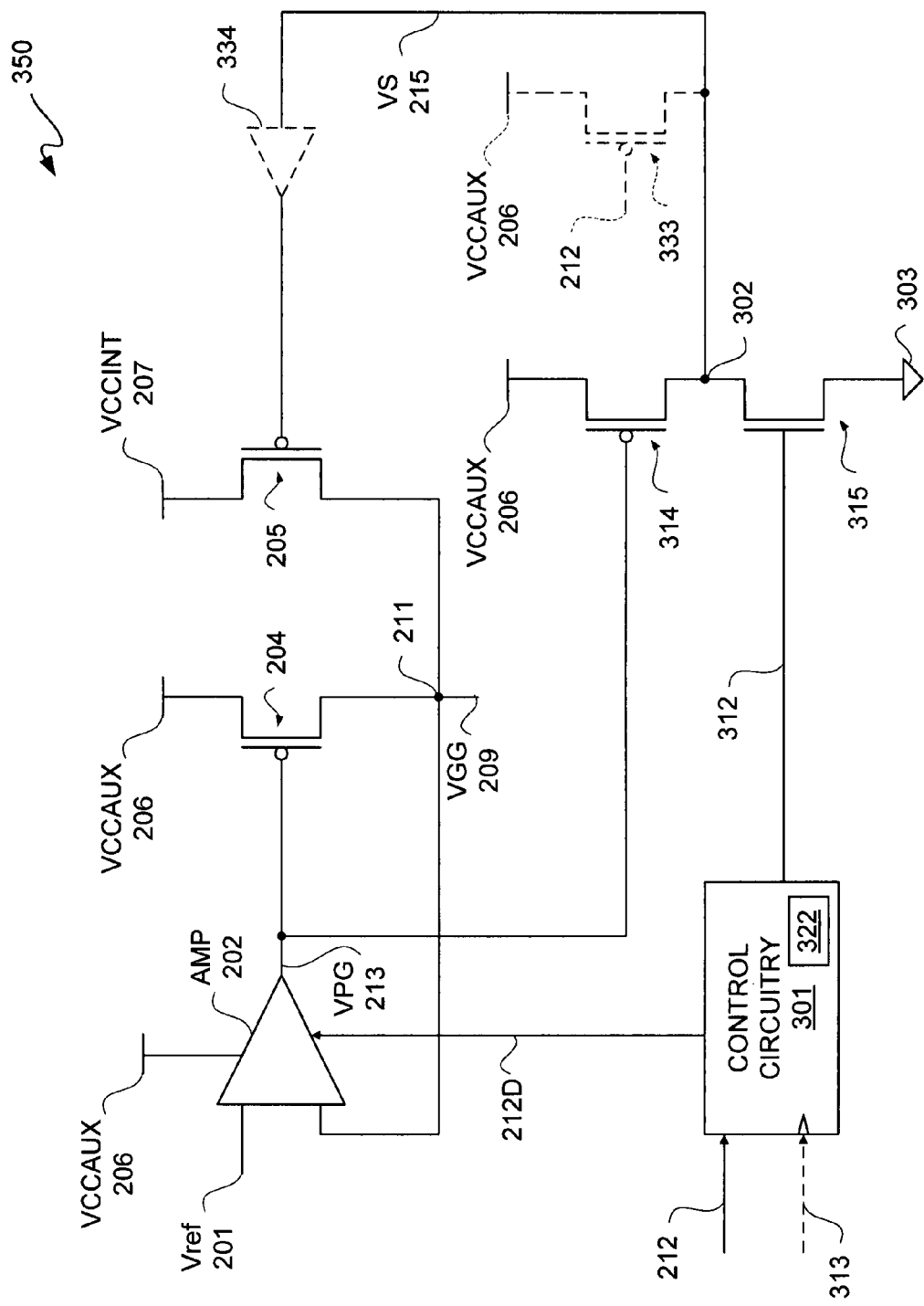
FIG. 3B is a block/circuit diagram depicting an alternative exemplary embodiment of the voltage regulator of FIG. 2.

Multiple voltage regulators may be driving VGG 209 node 211 in an FPGA. So some regulators may be off, namely VPG 213 of the OFF regulators are at a logic high voltage value, and remaining regulators may be on for supplying current. In instances where a regulator is off, off state leakage of transistors 314 and 315 determines VS 215 because transistors 314 and 315 are OFF in an awake mode of operation. If, however, transistor 315 leaks more than transistor 314, then VS 215 may be weakly electrical coupled to ground 303 and transistor 205 may thus turned ON electrically coupling VCCINT 207 to node 211 while VCCAUX 206 is electrically coupled to node 211 of the ON regulators causing a current path between VCCAUX 206 and VCCINT 207. To avoid this possibility, optional P-channel transistor 333 may be added as illustratively shown in FIG. 3B. FIG. 3B is a block/circuit diagram depicting an alternative exemplary embodiment of a voltage regulator 350. Voltage regulator 350 is voltage regulator 300 of FIG. 3A, except P-channel transistor 333 has been added. P-channel transistor 333 is in source-drain parallel with P-channel transistor 314. P-channel transistor 333 is gate with power-down signal 212. P-channel transistor 333 is ON during an awake mode, and thus pulls up VS 215 independently of VPG 213 in an awake mode. In a suspend mode, P-channel transistor 333 is OFF. Thus, P-channel transistor 333 prevents electrically coupling VCCINT 207 to node 211 while VCCAUX 206 is electrically coupled to node 211 due to N-channel transistor 315 being more leaky than P-channel transistor 314 as previously described. Furthermore, an optional level-shifter buffer 334 may be coupled to receive VS 215, and the output of level-shifter buffer 334 may gate P-channel transistor 205.

In FIGS. 3A and 3B, P-channel transistors 204 and 205 are illustratively shown. However, alternatively, P-channel transistors 204 and 205 may be replaced with respective N-channel transistors. However, as use of N-channel transistors will be understood from the following description, description of an N-channel transistors embodiment is not described for purposes of clarity and not limitation. Furthermore, alternatively a mix of PMOS and NMOS transistors may be used. However, for purposes of clarity by way of example and not limitation, the embodiment of FIG. 3A is further described herein.

To enter into a suspend mode from an awake mode, power-down signal 212, which as described above is negative logic, shall be a logic low or logic 0. For transitioning from a suspend mode to an awake mode, there need not be any delay, or optionally delay may be used, in providing power-down signal 312 and power-down signal 212D to AMP 202 other than to compensate for delay due to inversion of power-down signal 212 to provide power-down signal 312, such that signals 212D and 312 are provided at least approximately at the same time to a control port of AMP 202 and a gate of N-channel transistor 315. However, this delay of power-down signal 312 may optionally be omitted, and alternatively power-down signal 212 may be used to directly control operation of AMP 202.

However, power-down signal 312 output from control circuitry 301 is optionally delayed by control circuitry 301 prior to being provided to a gate of N-channel transistor 315 for transitioning from a suspend mode to an awake mode. Although power-down signal 312 is optionally delayed for transitioning from a suspend mode to an awake mode by control circuitry 301, power-down signal 312 need not be delayed by control circuitry 301 for transitioning from an awake mode to a suspend mode. This is because sizing of transistors 314 and 315 provides for a self-timed generation of delay for transitioning from an awake mode to a suspend mode, as described below in additional detail. Delay of power-down signal 312 is optional and may be programmable. Moreover, delay of power-down signal 312 may be part of a default configuration.

A logic 0 provided from power-down signal 212D as a control signal input to AMP 202 disables the bias circuit associated with AMP 202 and causes output of AMP 202 to be a logic 1. Output of AMP 202 is provided as an input to the gate of P-channel transistor 204 and as an input to the gate of P-channel transistor 314. Output of AMP 202 therefore is referenced as P-gate voltage (VPG) 213. A logic high output from AMP 202 pulls the gates of P-channel transistors 204 and 314 to a logic high state.

Accordingly, it may be understood that responsive to VPG 213 being a logic high, P-channel transistors 204 and 314 are at least substantially non-conductive across their channels, namely source-to-drain. In a suspend mode, VCCAUX 206 is effectively electrically decoupled from output node 211 responsive to output of AMP 202 being at logic high. Furthermore, P-channel transistor 314 has its source coupled to VCCAUX 206 and its drain coupled to sense node 302, which means that VCCAUX 206 is effectively electrically decoupled from sense node 302 responsive to VPG 213 being a logic high.

P-channel transistor 314 is drain-to-drain coupled to N-channel transistor 315 at sense node 302. A source of N-channel transistor 315 is coupled to a ground 303, which may be an actual ground or a virtual ground. From sense node 302, VS 215 may be sourced for gating P-channel transistor 205.

In the awake mode, P-channel transistor 205 is at least substantially non-conductive as being shut-off by application of VCCAUX 206 to a gate of P-channel transistor 205 via P-channel transistor 314. Power-down signal 312 is at a logic low state for turning OFF N-channel transistor 315 for electrically decoupling from ground 303. However, for a transition to a suspend mode, P-channel transistor 314 is switched to be substantially non-conductive, N-channel transistor 315 is turned ON by power-down signal 312 and thus VCCAUX 206 is electrically decoupled from the gate of P-channel transistor 205.

Power-down signal 312, which is a logic high in suspend mode and is provided to a gate of N-channel transistor 315, causes N-channel transistor 315 to be at least substantially conductive. Accordingly, sense node 302 is electrically decoupled from VCCAUX 206 and electrically coupled to ground 303, and thus a gate of P-channel transistor 205 is electrically coupled to ground 303. Coupling a gate of P-channel transistor 205 to ground 303 means that VCCINT 207 is electrically coupled by an at least substantially conductive P-channel transistor 205 to output node 211 for supplying VGG 209.

For purposes of clarity by way of example and not limitation, it shall be assumed that VCCAUX 206 is 2.5 volts, VCCINT 207 is 1.2 volts, and a target value for VGG 209 is 1.5 volts. The target value of 1.5 volts for VGG 209 is for an awake mode, as it is well understood that the higher voltage level is used for being able to write to configuration memory cells 208. Conventionally, Vref 201 may be set equal to or approximately equal to the target value for VGG 209. Thus, Vref 201 may be set approximately equal to 1.5 volts in this example. AMP 202 need not put out ground voltage level for a logic 0 for purposes of operating in an awake mode; rather, the difference between VCCAUX 206 and VPG 213 for operating P-channel transistor 204 in a substantially conductive mode need only differ by slightly more than one threshold voltage (VTP) of P-channel transistor 204. Thus, for the above numerical example, assuming threshold voltage of P-channel transistor 204 is approximately 500 mV to 700 mV, VPG 213 for an awake mode may be in a range of approximately 1.6 to 1.9 volts depending on how much amperage needs to pass through for the loading at output node 211.

Of course, output of AMP 202 may be driven to 0 volts for providing to the gate of P-channel transistor 204 if the amount of current to be provided for driving the load coupled to output node 211 is excessive. It should therefore be appreciated that both P-channel transistors 204 and 314 in an awake mode will be at least substantially conductive, if not fully conductive.

Assuming AMP 202 is powered by VCCAUX 206 as illustratively shown in FIG. 3A, responsive to the bias circuit associated with AMP 202 being disabled as described above, output of AMP 202 will be approximately the voltage level of VCCAUX 206, which will pull the gates of P-channel transistor 314 and P-channel transistor 204 up to the approximate voltage level of VCCAUX 206.

For power-down signal 312 being a logic high in transition to a suspend mode, N-channel transistor 315 transitions from a substantially non-conductive state to an at least substantially conductive state for purposes of electrically coupling ground 303 to the gate of P-channel transistor 205. P-channel transistor 205 therefore electrically couples VCCINT 207 to output node 211 for providing VGG 209 to configuration memory cells 208. VCCINT 207 may be unaltered from the voltage provided off-chip and thus may be subject to off-chip regulation. For example, if 1.2 volts is provided off-chip to a VCCINT input pin of an FPGA, then VCCINT 207 would be approximately 1.2 volts. VCCINT may alternatively be internally regulated in an IC.

It should be appreciated that load at node VPG 213 from P-channel transistor 204 may be significant. So when transitioning from an awake mode to a suspend mode, N-channel transistor 315 is put into a substantially conductive mode and P-channel transistor 314 is put into a substantially non-conductive mode; however, these transitions do not take place immediately. P-channel transistor 314 is sized so as to be larger than N-channel transistor 315, though not illustratively shown in FIG. 3A. Therefore, P-channel transistor 314 may be generally characterized as a strong P-channel transistor and N-channel transistor 315 may be generally characterized as a weak N-channel transistor. Accordingly, when transitioning from a suspend mode to an awake mode, N-channel transistor 315 contends at sense node 302 with P-channel transistor 314, which is driven by VPG 213.

When VPG 213 rises to approximately being within one VTP of P-channel transistor 314 of VCCAUX 206, only then will N-channel transistor 315 overcome this contention and pull sense node 302 to a ground potential for turning regulator P-channel transistor 205. Because of this self-timing or built in timing in delaying the transitioning from use of P-channel transistor 314 to use of N-channel transistor 315 for providing VS 215, there is a negligible amount of droop of VGG 209 and of leakage current between VCCAUX 206 and VCCINT 207 when switching from an awake mode to a suspend mode. As described below in additional detail, there is little opportunity for current to flow between VCCINT 207 and VCCAUX 206 or for VGG 209 to droop.

It should be appreciated that the relative strength or sizing of P-channel transistor 314 to N-channel transistor 315 is such that even if N-channel transistor 315 is completely conductive, P-channel transistor 314 still overcomes the electrical coupling of sense node 302 to ground 303 by providing VCCAUX 206 to sense node 302 up until or at least approximately until there is less than approximately one VTP of P-channel transistor 314 difference between VCCAUX 206 and VPG 213.

This means that when the transition does occur, namely when P-channel transistor 314 is substantially non-conductive and N-channel transistor 315 is substantially conductive and voltage at sense node 302 is at least approximately at ground potential of ground 303, P-channel transistor 205 is fully or at least approximately fully conductive. Because P-channel transistor 205 when activated for regulating VGG 209 is activated to be so conductive, there is less opportunity for drooping of VGG 209. P-channel transistor 204 is OFF at this time, as VPG 213 is at a VCCAUX 206 level and hence there is less opportunity for current to flow between VCCINT 207 and VCCAUX 206.

When transitioning voltage regulator 200 or 300 from a suspend mode to an awake mode, power-down signal 212 is a logic high level. This logic high level is passed along in the form of power-down signal 212D to a control input of AMP 202 to activate a bias circuit associated with AMP 202. Loading from P-channel transistor 204 may be significant and may cause voltage at node VPG 213 to change slowly. Furthermore, the output of AMP 202 drives a significantly large load, which will slowly adjust after VPG 213 goes below a level which is below one VTP of P-channel transistor 204 from a voltage level of VCCAUX 206. However, once below one VTP of P-channel transistor 204 from VCCAUX 206, P-channel transistor 204 and P-channel transistor 314 will transition from being substantially non-conductive to being substantially conductive. It is assumed for purposes of clarity and not limitation that transistors 204 and 314 have at least approximately equal VTPs.

VS 215 sourced from sense node 302 will rise and eventually shut off P-channel transistor 205 from regulating VGG 209. However, the relative speed at which VPG 213 goes from VCCAUX 206 for example to one VTP therebelow is slow as compared to the rate at which power-down signal 312 can transition from a logic high level to a logic low level due to the load at output node 211, as well as the relative size of P-channel transistors 204 and 314.

It should be appreciated that the loading on the output of AMP 202 is significant in part because of the loading of configuration memory cells 208 at output node 211 and in part because of the size of P-channel transistor 204. Accordingly, P-channel transistor 314 and N-channel transistor 315 have significantly less loading. Because of the large loading, VPG 213 changes more slowly than power-down signal 212. To avoid or reduce droop of VGG 209 responsive to this difference in reaction time, power-down signal 312 may be delayed to prevent or reduce such drooping when transitioning from a suspend mode to an awake mode. Again, delay of power-down signal 312 is optional, and may be part of a default configuration.

This delay may be a fixed delay or programmed into control circuitry 301. Such delay may optionally be indexed to a clock input 313, such as for use of a counter for example. A counter implemented in control circuitry 301 need only be triggered on one edge, for example a rising-edge-only-triggered counter 322. Furthermore, the delay between receiving a logic high power-down signal 212 and providing a logic low power-down signal 312 from such counter 322 may be in a range of approximately 0 to 3 microseconds. Thus, the amount of delay may be tailored for having a sufficient but not undue amount of delay during transition from a suspend mode to an awake mode with limited droop of VGG 209. Furthermore, by delaying application of a logic low level voltage from power-down signal 312 to make N-channel transistor 315 substantially non-conductive, there is a better timing balance with respect to electrically decoupling VCCINT 207 from output node 211 and tying VCCAUX 206 to output node 211, namely there is a negligible current flowing between VCCAUX 206 and VCCINT 207.

During this period of delay of application of a logic low for power-down signal 312 for transitioning from a suspend mode to an awake mode, AMP 202 is on and thus VCCINT 207 is electrically coupled to output node 211. This means that effectively the suspend mode is extended as VCCINT 207 is used to help provide VGG 209, as VPG 213 drops slowly across P-channel transistor 204 to regulate VGG 209. In other words, VCCINT 207 is used as a helper voltage for VCCAUX 206 during this extended suspend mode or early awake mode to reduce or minimize VGG 209 droop with a negligible amount of current flowing between VCCAUX 206 and VCCINT 207.

VPG 213 need not fall completely below one VTP from VCCAUX 206 before voltage at sense node 302 will rise; however, sizing of P-channel transistor 314 relative to N-channel transistor 315 may be targeted such that voltage at sense node 302 will rise at least approximately when VPG 213 is one VTP below VCCAUX 206. Example ratios of transistor width and length as between P-channel transistor 314 and N-channel transistor 315 may be on the order of 20:1 at one end and approximately 50:1 at another end of a range. These ratios are for purposes of clarity by way of example and not limitation. Moreover, such ratios as between same products may be different depending for example on semiconductor process variations. By having a strong P-channel transistor 314 in comparison to a weak N-channel transistor 315, complete dependence on a delay of control circuitry 301 in providing power down signal 312 may be avoided.

Because VCCINT 207 is at a lower voltage level than VCCAUX 206, and furthermore because VCCINT 207 does not supply power to as much circuitry as VCCAUX 206, use of VCCINT 207 to retain state of configuration memory cells 208 during a suspend mode has a significant advantage both with respect to reducing leakage current as well as reducing static power consumption. VCCAUX 206 as implemented in Spartan™-3A generation FPGAs operates in a range of approximately low tens to low hundreds of microamps in the suspend mode, in comparison to a range of approximately tens of milliamps in the awake mode. VCCINT 207 current operates in a range of approximately tens of milliamps in the suspend mode, in comparison to a range of approximately low tens of microamps in the awake mode. Accordingly, it should be appreciated that this reduction in power consumption facilitates low power applications including mobile applications. Furthermore, it should be appreciated that due to the elegant nature of the voltage circuitry described herein, such circuitry consumes small amounts of semiconductor area, power, and logic overhead while providing a reliable, regulated memory cell voltage when switching between awake and suspend modes.

While the foregoing describes exemplary embodiment(s) in accordance with one or more aspects of the invention, other and further embodiment(s) in accordance with the one or more aspects of the invention may be devised without departing from the scope thereof, which is determined by the claim (s) that follow and equivalents thereof. Claim(s) listing steps do not imply any order of the steps. Trademarks are the property of their respective owners.

What is claimed is:

1. A voltage regulator for supplying power to volatile memory cells, comprising:
   an amplifier coupled to receive a reference voltage and a regulated voltage and configured to provide a gating voltage;
   a first transistor coupled at a source node thereof to a first supply voltage and coupled at a gate thereof to receive the gating voltage;
   a second transistor coupled at a source node thereof to a second supply voltage;
   the second supply voltage having a logic high voltage level which is substantially less than that of the first supply voltage;
   the first transistor and the second transistor each having a drain node which is coupled at an output node;
   the regulated voltage being provided from the output node in part for a feedback input to the amplifier;
   the volatile memory cells being coupled to the output node for receiving the regulated voltage therefrom;
   control circuitry coupled to receive a first control signal and configured for providing control signaling, the control signaling including at least a second control signal;
   a third transistor coupled at a source node thereof to a ground potential and coupled at a gate thereof to receive the second control signal;

a resistive load coupled to receive the first supply voltage;
a drain node of the third transistor and the resistive load each coupled at a sense node; and
the second transistor coupled at a gate thereof to receive a sense voltage obtained from the sense node.

2. The voltage regulator according to claim 1, wherein:
the resistive load is provided via a fourth transistor coupled at a source node thereof to receive the first supply voltage and coupled at a gate thereof to receive the gating voltage;
the drain node of the third transistor and a drain node of the fourth transistor are each coupled at the sense node;
the voltage regulator is capable of being put in a suspend mode responsive to the first control signal;
in the suspend mode,
the first transistor and the fourth transistor are at least substantially non-conductive;
the second transistor and the third transistor are at least substantially conductive; and
the regulated voltage is sourced from the second supply voltage for providing to the volatile memory cells.

3. The voltage regulator according to claim 2, wherein:
the voltage regulator is capable of being put in an awake mode responsive to the first control signal;
in the awake mode,
the first transistor and the fourth transistor are at least substantially conductive;
the second transistor and the third transistor are at least substantially non-conductive; and
the regulated voltage is sourced from the first supply voltage for providing to the volatile memory cells.

4. The voltage regulator according to claim 3, wherein the control signaling includes a third control signal which is provided to the amplifier for activating and deactivating operation of the amplifier.

5. The voltage regulator according to claim 4, wherein the control circuitry is coupled to receive a clock signal for determining an amount of delay before providing the second control signal for transitioning from the suspend mode to the awake mode.

6. The voltage regulator according to claim 3, wherein relative strength of the fourth transistor is substantially greater than that of the third transistor.

7. The voltage regulator according to claim 6, wherein the amplifier is powered using the first supply voltage; and wherein the gating voltage is approximately one threshold voltage of the fourth transistor less than the first supply voltage before the sense voltage begins to rise when transitioning from the suspend mode to the awake mode.

8. The voltage regulator according to claim 7, wherein the first transistor, the second transistor, and the fourth transistor are all P-channel transistors; and wherein the third transistor is an N-channel transistor.

9. The voltage regulator according to claim 8, wherein the voltage regulator is located in a programmable logic device having the suspend mode as a dedicate low power mode of operation; and wherein the volatile memory cells are of configuration memory of the programmable logic device, the configuration memory being programmable for configuring programmable logic.

10. A method for regulating voltage, comprising:
toggling an integrated circuit between a suspend mode and an awake mode;
in the awake mode, generating a regulated voltage at an output node using a first supply voltage, the first supply voltage having a first voltage level;
in the suspend mode, generating the regulated voltage at the output node using a second supply voltage, the second supply voltage having a second voltage level which is substantially less than the first voltage level;
inputting a reference voltage and the regulated voltage to an amplifier;
producing a gating voltage from the amplifier;
disabling the amplifier for bias circuit operation thereof for the suspend mode, wherein the gating voltage is provided from the amplifier at the first voltage level; and
activating the amplifier for the bias circuit operation thereof for the awake mode, wherein the gating voltage is less than the first voltage level and greater than a regulated voltage level of the regulated voltage;
electrically decoupling the second supply voltage from the output node for transitioning from the suspend mode to the awake mode; and
electrically decoupling the first supply voltage from the output node for transitioning from the awake mode to the suspend mode.

11. The method according to claim 10, wherein the transitioning from the suspend mode to the awake mode includes extending the suspend mode to allow the second supply voltage to assist the first supply voltage in providing the regulated voltage to compensate for delay due load driven by the gating voltage.

12. The method according to claim 11, wherein the extending includes delaying the electrical decoupling of the second supply voltage from the output node from which the regulated voltage is provided by delayed application of a control signal for the electrical decoupling of the second supply voltage.

13. The method according to claim 12, further comprising maintaining state of volatile memory cells by use of the regulated voltage generated when in the suspend mode.

14. The method according to claim 13, wherein the volatile memory cells are of configuration memory of a programmable logic device, the configuration memory being programmable for configuring programmable logic of the programmable logic device.

15. The method according to claim 14, wherein the volatile memory cells are static random access memory cells.

16. The method according to claim 10, wherein the transitioning from the awake mode to the suspend mode includes extending the awake mode.

17. The method according to claim 16, wherein the extending includes delaying the electrical decoupling of the first supply voltage from a sense node, the delaying obtained by sizing a voltage pull-up transistor coupled to the sense node to be substantially larger than a voltage pull-down transistor coupled to the sense node.

18. The method according to claim 17, further comprising maintaining state of volatile memory cells by use of the regulated voltage generated when in the suspend mode.

19. The method according to claim 18, wherein the volatile memory cells are of configuration memory of a programmable logic device, the configuration memory being programmable for configuring programmable logic.

20. The method according to claim 19, wherein the volatile memory cells are static random access memory cells.

* * * * *